United States Patent [19]

Hayakawa et al.

[11] Patent Number: 4,870,451
[45] Date of Patent: Sep. 26, 1989

[54] IMAGE RECORDING APPARATUS
[75] Inventors: Kiyoharu Hayakawa, Ama; Yumio Matsumoto, Kasugai; Masashi Ueda, Nagoya; Akira Sago, Nagoya; Osamu Takagi, Nagoya, all of Japan
[73] Assignee: Brother Kogyo Kabushiki Kaisha, Aichi, Japan
[21] Appl. No.: 201,540
[22] Filed: Jun. 2, 1988
[30] Foreign Application Priority Data
   Jun. 8, 1987 [JP] Japan .................. 62-142560
[51] Int. Cl.⁴ ............................................. G03B 27/52
[52] U.S. Cl. ...................................... 355/27; 271/184
[58] Field of Search .................... 355/27, 28, 68; 271/184, 225; 346/107 R, 136
[56]       References Cited
       U.S. PATENT DOCUMENTS
   4,777,513 10/1988 Nelson .................... 355/27

Primary Examiner—L. T. Hix
Assistant Examiner—D. Rutledge
Attorney, Agent, or Firm—Kane, Dalsimer, Sullivan, Kurucz, Levy, Eisele and Richard

[57]       ABSTRACT

In an image recording apparatus, a developing sheet is fed by a feeder substantially horizontally along a predetermined transport path. A pair of pressurizing and developing rollers are arranged in a plane substantially parallel to the developing sheet fed by the feeder. A guide arrangement is arranged in the predetermined transport path for changing a course of the developing sheet fed by the feeder and for guiding the developing sheet to a nip defined between the pair of pressurizing and developing rollers. A pressure-sensitive recording medium having carried thereon a latent image and the developing sheet are caused to pass through the nip, with the pressure-sensitive recording medium and the developing sheet superposed upon each other. The pressurizing and developing rollers cooperate with each other to apply pressure to the pressure-sensitive recording medium and the developing sheet to develop the latent image on the pressure-sensitive recording medium, onto the developing sheet.

18 Claims, 1 Drawing Sheet

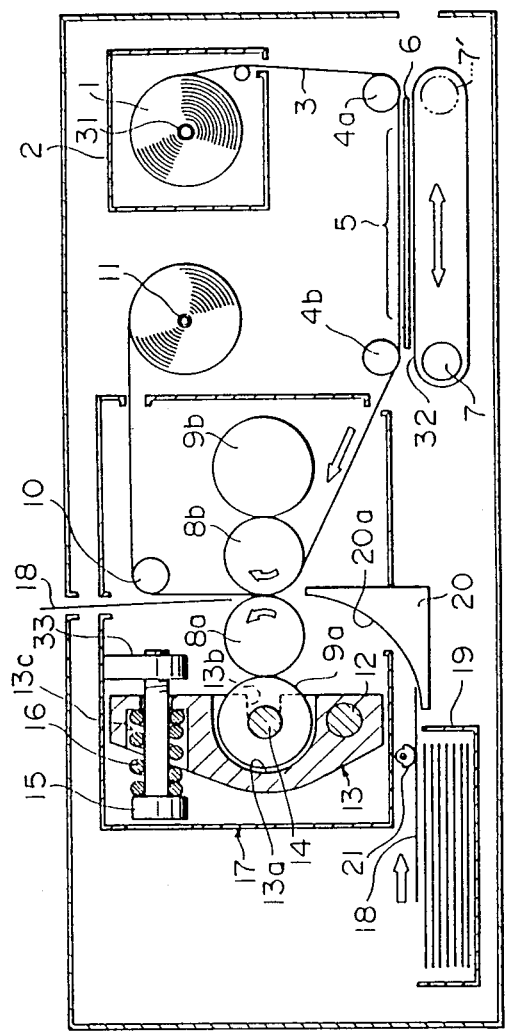

IMAGE RECORDING APPARATUS

BACKGROUND OF THE INVENTION

This invention relates to an image recording apparatus wherein a latent image on a pressure-sensitive recording medium is developed onto a developing sheet to record an image corresponding to the latent image, onto the developing sheet.

Conventionally, a technique has already been known from, for example, Japanese Patent Application Laid-Open No. 58-88740 or the like, in which a pressure-sensitive recording medium is subjected to predetermined exposure processing, and the pressure-sensitive recording medium and a developing sheet superposed upon each other are pressurized to develop a latent image on the pressure-sensitive recording medium, onto the developing sheet. In general, an apparatus realizing the above technique, that is, an image recording apparatus, often employs a pressure-sensitive continuous web wound into a roll as the pressure-sensitive recording medium, and a cut sheet as the developing sheet. In this case, it is important for avoidance of an increase in overall height dimension of the apparatus and for achievement of reduction in size of the apparatus, in what manner the developing sheet is arranged within the apparatus and in what manner the developing sheet is fed to a nip between a pair of pressurizing and developing rollers.

SUMMARY OF THE INVENTION

It is therefore an object of this invention to provide an improved image recording apparatus capable of simplifying a feed mechanism for a developing sheet, thereby avoiding an increase in overall height dimension of the apparatus and thereby achieving reduction in size of the apparatus and improvement in economy thereof.

For the above purpose, according to the invention, there is provided an image recording apparatus wherein a latent image on a pressure-sensitive recording medium is developed onto a developing sheet to record an image corresponding to the latent image, onto the developing sheet, which comprises:

feed means for feeding the developing sheet substantially horizontally along a predetermined transport path;

a pair of pressurizing and developing rollers arranged in a plane substantially parallel to the developing sheet fed substantially horizontally along the predetermined transport path by the feed means, the pair of pressurizing and developing rollers cooperating with each other to define therebetween a nip extending substantially perpendicularly to the predetermined transport path; and guide means arranged in the predetemined transport path for changing a course of the developing sheet fed along the predetemined tansport path by the feed means and for guiding the developing sheet to the nip between the pair of pressurizing and developing rollers, wherein the pressure-sensitive recording medium having carried thereon the latent image and the developing sheet are caused to pass through the nip between the pair of pressurizing and developing rollers, with the pressure-sensitive recording medium and the developing sheet superposed upon each other, and wherein the pair of pressurizing and developing rollers cooperate with each other to apply pressure to the pressure-sensitive recording medium and the developing sheet caused to pass through the nip between the pressurizing and developing rollers, to develop the latent image on the pressure-sensitive recording medium, onto the developing sheet.

BRIEF DESCRIPTION OF THE ACCOMPANYING DRAWING

FIG. is a schematic structural view of an image recording apparatus embodying the invention.

DESCRIPTION OF THE EMBODIMENT

Referring to Figure, there is shown an image recording apparatus embodying the invention, in which a continuous photo and pressure sensitive recording web 3 is employed which is wound into a roll 1 around a core 31. The roll 1 is accommodated in a roll cassette 2 detachably mounted within a chassis of the image recording apparatus. The photo and pressure sensitive recording web 3 unwound from the roll 1 and drawn out of the roll cassette 2 is transported along a predetermined traveling path. Specifically, the photo and pressure sensitive recording web 3 is first guided horizontally by a pair of guide rollers 4a and 4b between which an exposure station 5 is arranged. Subsequently, the photo and pressure sensitive recording web 3 enters a pressure-fixing unit 17 in which the web 3 is first caused to pass through a nip defined between a pair of pressurizing and developing rollers 8a and 8b, is changed in course by a separator roller 10, and then is wound around a take-up roller 11.

The exposure station 5 is arranged upstream of the nip between the pair of pressurizing and developing rollers 8a and 8b with reference to a traveling direction of the photo and pressure sensitive recording web 3 along the predetermined traveling path. The exposure station 5 includes a platen 32 on which an original 6 having image information is set, and an exposure fluorescent lamp 7. When turned on, the exposure fluorescent lamp 7 illuminates the original 6 on the platen 32 with light to expose the original 6, thereby forming a latent image corresponding to the image information on the original 6, onto a longitudinal portion of the photo and pressure sensitive recording web 3. The platen 32 is located below and parallel to the longitudinal portion of the photo and pressure sensitive recording web 3 extending between the pair of guide rollers 4a and 4b. The exposure fluorescent lamp 7 is arranged below the original 6 on the platen 32 and is reciprocatively movable along the original 6 on the platen 32 between a position indicated by the soild line and a position 7' indicated by the phantom line.

The pair of pressurizing and developing rollers 8a and 8b within the pressure-fixing unit 17 are arranged in a horizontal plane above the exposure station 5. More specifically, the pair of pressurizing and developing rollers 8a and 8b have their respective axes extending in the horizontal plane in parallel relation to each other. A pair of backup rollers 9a and 9b are associated respectively with the pair of pressurizing and developing rollers 8a and 8b. One of the backup rollers 9a is rotatable about its own axis and is movable toward and away from the associated pressurizing and developing roller 8a, while the other backup roller 9b is rotatable about its own axis, but is immovalbe toward and away from the associated pressurizing and developing roller 8b.

The pressure-fixing unit 17 has incorporated therein an urging arrangement which comprises a pivot 12 having an axis extending parallel to the axes of the respective pressurizing and developing rollers 8a and 8b. A lever 13 is mounted at its one end on the pivot 12 for angular movement about an axis thereof. The lever 13 is formed therein with a recess 13a at a location between the one and other ends of the lever 13. A pair of opposed U-shaped grooves 13b (only one shown in the figure) are also provided in the lever 13 at the recess 13a. A shaft 14, on which the backup roller 9a is rotatably mounted, is received in the pair of U-shaped grooves 13a in such a manner that the backup roller 9a is accommodated in the recess 13a. A bore 13c having a bottom wall is formed in the lever 13 adjacent the other end thereof. An adjusting screw 15 passes through a bore formed in the bottom wall of the bore 13c and has a forward end portion threadedly engaged with a bracket 33 secured to a casing of the pressure-fixing unit 17. A coil spring 16 is arranged about the adjusting screw 15 and is interposed under compression between a head of the adjusting screw 15 and the bottom wall of the bore 13c. Thus, the urging arrangement urges the backup roller 9a against the pressurizing and developing roller 8a which, in turn, is urged against the pressurizing and developing roller 8b backed up by the backup roller 9b. Screwing or unscrewing of the adjusting screw 15 with respect to the bracket 33 enables biasing force of the coil spring 16 to be varied, thereby adjusting the urging force by which the backup roller 9a is urged against the pressurizing and developing roller 8a.

A sheet feed cassette 19 is detachably mounted within the chassis of the image recording apparatus, and is arranged below the horizontal plane in which the pair of pressurizing and developing rollers 8a and 8b are arranged. A stack of a plurality of developing cut sheets 18 is horizontally accommodated in the sheet feed cassette 19. The developing sheets 18 within the sheet feed cassette 19 are fed one by one by a sheet feed roller 21 along a predetermined transport path extending substantially horizontally. The nip defined between the pair of pressurizing and developing rollers 8a and 8b extends perpendicularly to the predetermined transport path along which the developing sheet 18 is transported.

A guide arrangement is arranged in the predetermined transport path for changing a course of the developing sheet 18 fed along the predetermined transport path by the sheet feed roller 21 and for guiding the developing sheet 18 to the nip between the pair of pressurizing and developing rollers 8a and 8b. Specifically, the guide arrangement comprises a fixed guide member 20 provided with a guide surface which is formed by a curved concave surface 20a for changing, substantially vertically and upwardly, the course of the developing sheet 18 fed along the predetermined transport path by the sheet feed roller 21, and for guiding the developing sheet 18 to the nip between the pair of pressurizing and developing rollers 8a and 8b.

The operation of the image recording apparatus constructed as above will next be described below.

The photo and pressure sensitive recording web 3 is unwound from the roll 1, and a longitudinal fresh portion of the web 3 is brought to the exposure station 5 at which the original 6 is beforehand set on the platen 32. The exposure fluorescent lamp 7 is turned on and is reciprocatively moved from the position indicated by the solid line to the position 7' indicated by the phantom line. The exposure fluorescent lamp 7 exposes the original 6 to form a latent image corresponding to the image information on the original 6, onto the longitudinal portion of the photo and pressure sensitive recording web 3. The web 3 is transported along the predetermined traveling path so that the longitudinal portion of the web 3 having formed thereon the latent image moves toward the nip between the pair of pressurizing and developing rollers 8a and 8b within the pressure-fixing unit 17. In synchronism with movement of the longitudinal portion of the web 3 toward the nip between the rollers 8a and 8b, the developing sheet 18 is fed along the predetermined transport path by the sheet feed roller 21. The course of the developing sheet 18 fed along the predetermined transport path by the sheet feed roller 21 is changed substantially vertically and upwardly by the curved concave surface 20a of the guide member 20, and the developing sheet 18 is guided by the curved concave surface 20a toward the nip between the pressurizing and developing rollers 8a and 8a. The longitudinal portion of the photo and pressure sensitive recording web 3 and the developing sheet 18 are then caused to pass through the nip between the pressurizing and developing rollers 8a and 8b, with the longitudinal portion of the web 3 and the developing sheet 18 superposed upon each other. The pair of pressurizing and developing rollers 8a and 8b cooperate with each other to apply the pressure determined by the biasing force of the coil spring 16, to the longitudinal portion of the web 3 and the developing sheet 18 to develop the latent image on the longitudinal portion of the web 3 onto the developing sheet 18. Thus, an image corresponding to the latent image on the longitudinal portion of the web 3 is formed and fixed onto the developing sheet 18. After the development and fixture, the developing sheet 18 is discharged out of the chassis of the image recording apparatus. On the other hand, the longitudinal portion of the web 3 is changed in course by the separator roller 10 and is wound about the take-up roller 11.

In this manner, the arrangement of the image recording apparatus is such that the feeding direction of the developing sheet 18 is changed by the curved concave surface 20a of the guide member 20 from the horizontal direction to the vertically upward direction, and the developing sheet 18 is fed, as it is, into the nip between the pair of pressurizing and developing rollers 8a and 8b. With such arrangement, it is sufficient for a feed mechanism for the developing sheet 18 to be provided merely with the sheet feed roller 21 for feeding the developing sheets 18 one by one from the sheet feed cassette 19 and, in addition thereto, the guide member 20 formed with the curved concave surface 20a. Moreover, since the developing sheets 18 are accommodated in the sheet feed cassette 19 in a horizontal manner, it is possible to avoid an increase in the overall height dimension of the image recording apparatus.

It is to be noted that the invention is not limited to the specific form descirbed above, but various modifications and variations can be made to the invention. For example, although it has been described that the axes of the respective pressurizing and developing rollers 8a and 8b extend parallel to each other, the axes of the respective rollers 8a and 8b may extend at an angle to each other. Further, the developing sheets 18 may be fed manually one by one into the image recording apparatus, without the use of the sheet feed cassette 19. Moreover, it is of course that photo and pressure developing cut sheets may be used in substitution for the continuous recording web 3. Furthermore, the backup roller 9b may be movable toward and away from the associated pressurizing and developing roller 8b, and an additional urging arrangement may be associated with the backup roller 9b such that both the backup rollers 9a and 9b are urged respectively against the pair of pressurizing and developing rollers 8a and 8b.

As described above, the invention is advantageous in that simplification of the feed mechanism for the developing sheet enables the entire apparatus to be reduced in size, and also enables the apparatus to be reduced in cost. Accordingly, the invention is effectively applicable, in particular, to a desk-type copying machine and the like.

What is claimed is

1. An image recording apparatus wherein a latent image on a pressure-sensitive recording medium is developed onto a developing sheet to record an image corresponding to said latent image, onto said developing sheet, which comprises:

feed means for feeding said developing sheet substantially horizontally along a predetermined transport path;

a pair of pressurizing and developing rollers arranged in a plane substantially parallel to said developing sheet fed substantially horizontally along said predetermined transport path by said feed means, said pair of pressurizing and developing rollers cooperating with each other to define therebetween a nip extending substantially perpendicularly to said predetermined transport path; and guide means arranged in said predetermined transport path for changing a course of said developing sheet fed along said predetermined transport path by said feed means and for guiding developing sheet to said nip between said pair of pressurizing and developing rollers, wherein said pressure-sensitive recording medium having carried thereon said latent image and said developing sheet are caused to pass through said nip between said pair of pressurizing and developing rollers, with said pressure-sensitive recording medium and said developing sheet superposed upon each other, and wherein said pair of pressurizing and developing rollers cooperate with each other to apply pressure to said pressure-sensitive recording medium and said developing sheet caused to pass through said nip between said pressurizing and developing rollers, to develop said latent image on said pressure-sensitive recording medium, onto said developing sheet.

2. The image recording apparatus according to claim 1, wherein said guide means comprises a fixed guide member provided with a guide surface for guiding said developing sheet fed along said predetermined transport path by said feed means, to said nip between said pair of pressurizing and developing rollers.

3. The image recording apparatus according to claim 2, wherein said guide surface of said guide member is formed by a curved concave surface.

4. The image recording apparatus according to claim 3, wherein said plane is located above said predetermined transport path, and wherein said curved concave surface of said guide member changes, substantially vertically and upwardly, the course of said developing sheet fed along said predetermined transport path by said feed means, and guides said developing sheet to said nip between said pair of pressurizing and developing rollers.

5. The image recording apparatus according to claim 4, wherein said pair of pressurizing and developing rollers have their respective axes extending in said plane in parallel relation to each other.

6. The image recording apparatus according to claim 1, further comprising a sheet feed cassette in which a stack of a plurality of developing sheets is horizontally accommodated, the developing sheets within said sheet feed cassette being fed one by one along said predetermined transport path by said feed means.

7. The image recording apparatus according to claim 6, wherein said sheet feed cassette is arranged below said plane.

8. The image recording apparatus according to claim 1, wherein said pressure-sensitive recording medium is comprised of a pressure-sensitive continuous web wound into a roll, said pressure-sensitive continuous web unwound from said roll being transported along a predetermined traveling path passing through said nip between said pair of pressurizing and developing rollers.

9. The image recording apparatus according to claim 8, further comprising an exposure station arranged upstream of said nip between said pair of pressurizing and developing rollers with reference to a traveling direction of said pressure-sensitive continuous web along said predetermined traveling path, said exposure station including a platen on which an original having image information is set, and exposure means for exposing the original on said platen to form said latent image corresponding to the image information on the original, onto a longitudinal portion of said pressure-sensitive continuous web.

10. The image recording apparatus according to claim 9, wherein said platen is located below and parallel to said longitudinal portion of said pressure-sensitive continous web, and wherein said exposure means has an exposure fluorescent lamp arranged below said platen for illuminating the original on said platen with light, said exposure fluorescent lamp being reciprocatively movable along the original on said platen.

11. The image recording apparatus according to claim 10, wherein said pair of pressurizing and developing rollers have their respective axes extending in said plane in parallel relation to each other.

12. The image recording apparatus according to claim 1, further comprising a pair of backup rollers associated respectively with said pair of pressurizing and developing rollers, and urging means for urging at least one of said pair of backup rollers aginst one of said pair of pressurizing and developing rollers associated with the one backup roller, for applying the pressure to said pressure-sensitive recording medium and said developing sheet caused to pass through said nip between said pair of pressurizing and developing rollers.

13. The image recording apparatus according to claim 12, wherein one of said backup rollers is rotatable about its own axis and is movable toward and away from one of said pair of pressurizing and developing rollers associated with the one backup roller, while the other backup roller is rotatable about its own axis, but is immovable toward and away from the other pressurizing and developing roller.

14. The image recording apparatus according to claim 13, wherein said pair of pressurizing and developing rollers have their respective axes extending in said plane in parallel relation to each other.

15. The image recording apparatus according to claim 14, wherein said pair of backup rollers have their respective axes extending in said plane in parallel relation to the axes of the respective pressurizing and developing rollers.

16. The image recording apparatus according to claim 15, wherein said urging means comprises a pivot having an axis extending parallel to the axis of the respective pressurizing and developing rollers, a lever on which the one backup roller is mounted for rotation about its own axis, said lever being mounted on said pivot for angular movement about the axis of said pivot, and spring means biasing said lever to urge the one backup roller against the one pressurizing and developing roller.

17. The image recording apparatus according to claim 16, wherein said lever has one end mounted on said pivot and the other end with which said spring means is associated, the one backup roller being mounted on said lever at a location between the one and other ends of said lever.

18. The image recording apparatus according to claim 17, wherein said urging means further comprises means for adjusting biasing force of said spring means.

* * * * *